(12) United States Patent
Lee et al.

(10) Patent No.: US 9,312,210 B2
(45) Date of Patent: Apr. 12, 2016

(54) SEMICONDUCTOR DEVICE WITH AIR GAP AND METHOD FOR FABRICATING THE SAME

(75) Inventors: Hyo-Seok Lee, Gyeonggi-do (KR); Seung-Jin Yeom, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 22 days.

(21) Appl. No.: 13/606,648

(22) Filed: Sep. 7, 2012

(65) Prior Publication Data

US 2013/0320549 A1 Dec. 5, 2013

(30) Foreign Application Priority Data

May 31, 2012 (KR) ........................ 10-2012-0058425

(51) Int. Cl.
| | |
|---|---|
| H01L 29/40 | (2006.01) |
| H01L 23/482 | (2006.01) |
| H01L 21/764 | (2006.01) |
| H01L 21/768 | (2006.01) |
| H01L 27/108 | (2006.01) |

(52) U.S. Cl.
CPC .......... *H01L 23/4821* (2013.01); *H01L 21/764* (2013.01); *H01L 21/7682* (2013.01); *H01L 21/76831* (2013.01); *H01L 21/76897* (2013.01); *H01L 27/10855* (2013.01); *H01L 27/10885* (2013.01); *H01L 2924/0002* (2013.01)

(58) Field of Classification Search
CPC ......................... H01L 21/7682; H01L 21/764

USPC ........................... 438/619, 666; 257/619, 773
See application file for complete search history.

(56) References Cited

U.S. PATENT DOCUMENTS

| 8,642,466 | B2* | 2/2014 | Kim .................. H01L 21/76897 438/619 |
|---|---|---|---|
| 2004/0164328 | A1* | 8/2004 | Lee .................... H01L 27/10888 257/213 |
| 2007/0257368 | A1* | 11/2007 | Hussein .............. H01L 21/7682 257/758 |
| 2008/0174017 | A1* | 7/2008 | Yang et al. ..................... 257/751 |
| 2010/0285662 | A1* | 11/2010 | Kim .................... H01L 21/7682 438/675 |

FOREIGN PATENT DOCUMENTS

KR 20010011638 A * 2/2001

* cited by examiner

*Primary Examiner* — Mark Tornow
*Assistant Examiner* — Abbigale Boyle
(74) *Attorney, Agent, or Firm* — IP&T Group LLP

(57) ABSTRACT

A method for fabricating a semiconductor device includes forming, over a substrate, a plurality of first conductive structures which are separated from one another; forming multi-layered dielectric patterns including a first dielectric layer which covers upper ends and both sidewalls of the first conductive structures; removing portions of the first dielectric layer starting from lower end portions of the first conductive structures to define air gaps, and forming second conductive structures which are filled between the first conductive structures.

14 Claims, 14 Drawing Sheets

SEMICONDUCTOR DEVICE WITH AIR GAP AND METHOD FOR FABRICATING THE SAME

CROSS-REFERENCE TO RELATED APPLICATIONS

The present application claims priority of Korean Patent Application No. 10-2012-0058425, filed on May 31, 2012, which is incorporated herein by reference in its entirety.

BACKGROUND

1. Field

Exemplary embodiments of the present invention relate to a semiconductor device, and more particularly, to a semiconductor device with an air gap and a method for fabricating the same.

2. Description of the Related Art

In general, a semiconductor device such as a DRAM (dynamic random access memory) includes a plurality of first conductive structures and a plurality of second conductive structures which are formed between the first conductive structures with a dielectric layer interposed therebetween. For example, the first conductive structures may include gate electrodes, bit lines, metal lines, etc. The second conductive structures may include contact plugs, storage node contact plugs, bit line contact plugs, through vias, and the like.

As a semiconductor device is highly integrated, a gap between the first conductive structure and the second conductive structure gradually decreases. Due to the decreased gap, the parasitic capacitance between the first conductive structure and the second conductive structure increases. In particular, in the case of a DRM in which a bit line and a storage node contact plug adjoin each other, as the parasitic capacitance between the bit line and the storage node contact plug increases, an operation speed slows down and a refresh characteristic is degraded.

In order to reduce the parasitic capacitance, a method of minimizing an area (hereinafter, referred to as a 'facing area') where the first conductive structure and the second conductive structure face each other has been suggested. Otherwise, in order to reduce the parasitic capacitance, it is necessary to increase a gap (i.e., distance) between the conductive structures. However, in order to reduce the size of a product to increase an integration degree, there are some limitations in increasing the gap. Also, another effective way of reducing the facing area is to decrease the height of any one of the first conductive structure and the second conductive structure. Nevertheless, if the height is decreased, resistance increases.

Thus, the best way of reducing the parasitic capacitance is to decrease the dielectric constant of the dielectric layer formed between the first conductive structure and the second conductive structure. The dielectric layer generally used in a semiconductor device includes a silicon oxide and a silicon nitride. The silicon oxide has the dielectric constant of about 3.9, and the silicon nitride has the dielectric constant of about 7.

Since the silicon oxide and the silicon nitride have still high dielectric constants, restrictions may exist in reducing the parasitic capacitance.

SUMMARY

Embodiments of the present invention are directed to a semiconductor device capable of reducing parasitic capacitance between adjoining conductive structures, and a method for fabricating the same.

In accordance with an embodiment of the present invention, a method for fabricating a semiconductor device may include: forming, over a substrate, a plurality of first conductive structures which are separated from one another; forming multi-layered dielectric patterns including a first dielectric layer which covers upper ends and both sidewalls of the first conductive structures; removing portions of the first dielectric layer starting from lower end portions of the first conductive structures to define air gaps; and forming second conductive structures which are filled between the first conductive structures.

In accordance with another embodiment of the present invention, a method for fabricating a semiconductor device includes: forming preliminary storage node contact plugs over a substrate; forming hard mask patterns over the preliminary storage node contact plugs; etching the preliminary storage node contact plugs using the hard mask patterns as an etch barrier, and forming storage node contact plugs which are separated from one another by a plurality of open parts; forming multi-layered dielectric patterns including a first dielectric layer which covers both sidewalls of the storage node contact plugs and upper ends and both sidewalls of the hard mask patterns; removing portions of the first dielectric layer starting from lower end portions of the storage node contact plugs to define air gaps; and filling bit lines in the open parts between the storage node contact plugs.

In accordance with yet another embodiment of the present invention, a semiconductor device includes: a plurality of storage node contact plugs formed over a substrate and separated from one another by open parts; bit lines filled in the open parts; oxide spacers formed between the bit lines and the storage node contact plugs; air gaps defined between the oxide spacers and the storage node contact plugs; and a capping layer capping upper ends of the air gaps and containing boron.

In accordance with another embodiment of the present invention, a semiconductor device includes a first conductive pattern; a second conductive pattern; and a dielectric pattern located between the first conductive pattern and the second conductive pattern, including plural dielectric layers and an empty space.

DETAILED DESCRIPTION

Figure 1:
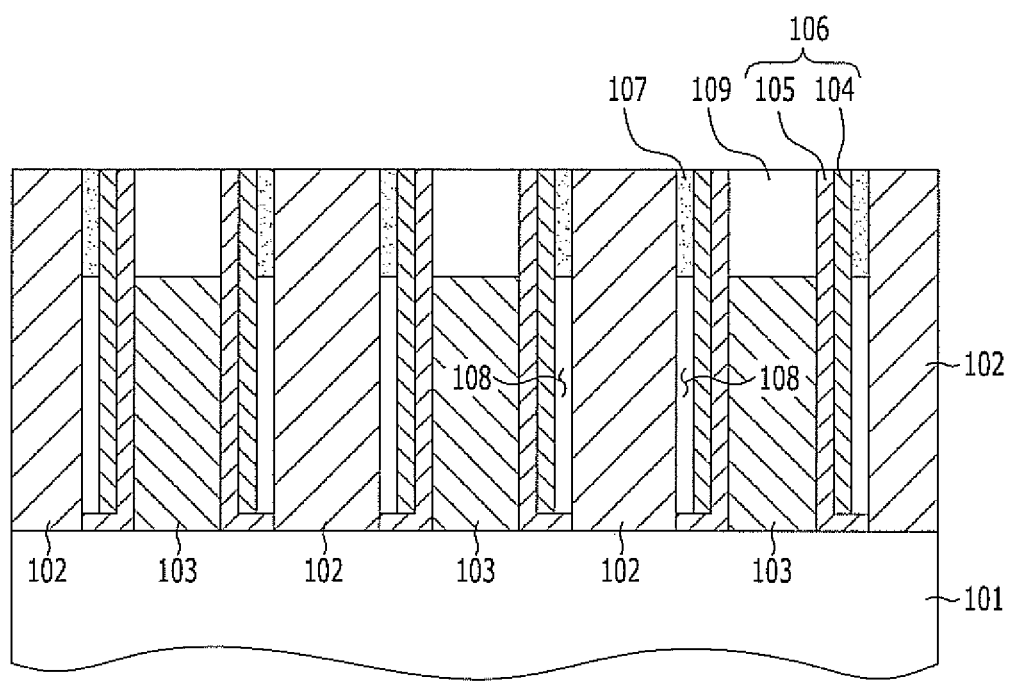
FIG. 1 is a cross-sectional view illustrating a semiconductor device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross-sectional view illustrating a semiconductor device in accordance with a first embodiment of the present invention.

Referring to FIG. 1, a plurality of first conductive patterns 102 are formed on a semiconductor substrate 101. The first conductive patterns 102 may include a conductive substance such as a polysilicon, a metal, a metal nitride, and a metal silicide. The first conductive patterns 102 may be formed of any one of such conductive substances, or formed as a stack structure of at least two of such conductive substances. The first conductive patterns 102 may be a line type which extends in any one direction. Also, the first conductive patterns 102 may have plug-like shapes. While not shown, an underlying structure and an interlayer dielectric layer may be additionally formed on the semiconductor substrate 101. The underlying structure may include a conductive substance such as a polysilicon, a metal, a metal nitride, and a metal silicide. The interlayer dielectric layer may include a silicon oxide, a silicon nitride, or the like. The interlayer dielectric layer may cover the underlying structure. The underlying structure may have plug-like shapes which pass through the interlayer dielectric layer. The underlying structure may be formed under the first conductive patterns 102, or may be exposed between the first conductive patterns 102. The first conductive patterns 102 may include gate electrodes, bit lines, metal lines, contact plugs, and so on. The first conductive patterns 102 may be regularly disposed with a predetermined gap on the semiconductor substrate 101.

A plurality of second conductive patterns 103 are formed between the plurality of first conductive patterns 102. The second conductive patterns 103 may include a conductive substance such as a polysilicon, a metal, a metal nitride, and a metal silicide. The second conductive patterns 103 may be formed of any one of such conductive substances, or formed as a stack structure of at least two of such conductive substances. The second conductive patterns 103 may be a line type which extends in any one direction. Also, the second conductive patterns 103 may have plug-like shapes. The second conductive patterns 103 may include gate electrodes, bit lines, metal lines, contact plugs, and so on. The second conductive patterns 103 may be regularly disposed on the semiconductor substrate 101. For example, in the case where the first conductive patterns 102 include gate electrodes, the second conductive patterns 103 may include contact plugs. Also, in the case where the first conductive patterns 102 include storage node contact plugs, the second conductive patterns 103 may include bit lines. At this time, the bit lines may include damascene bit lines. A hard mask layer 109 may be additionally formed on the second conductive patterns 103.

Spacers 106 are formed between the first conductive patterns 102 and the second conductive patterns 103. The spacers 106 may include a plurality of dielectric layers. For example, the spacers 106 may include first spacers 104 and second spacers 105. As the first spacers 104 and the second spacers 105 which constitute the spacers 106, a substance with a low dielectric constant may be selected to reduce the parasitic capacitance between the first conductive patterns 102 and the second conductive patterns 103. The first spacers 104 and the second spacers 105 may include substances with the same dielectric constant. The first spacers 104 and the second spacers 105 may be formed of the same substance, for example, an oxide such as $SiO_2$. The first spacers 104 and the second spacers 105 may have spacer shapes which have the same height as the first conductive patterns 102.

Air gaps 108 are defined between the spacers 106 and the first conductive patterns 102. A capping layer 107 is formed on the air gaps 108. The capping layer 107 may include a nitride. For example, the capping layer 107 may include a silicon nitride or a boron-containing nitride. The boron-containing nitride may include a boron nitride (BN). The capping layer 107 covers the sidewalls of the upper portions of the first conductive patterns 102. The air gaps 108 are defined under the capping layer 107. The air gaps 108 may be defined as portions of the capping layer 107 are removed. Due to the presence of the air gaps 108 with the dielectric constant of 1, the parasitic capacitance between the first conductive patterns 102 and the second conductive patterns 103 may be significantly reduced. The capping layer 107 caps the upper ends of the air gaps 108. The second spacers 105 serve to cap the lower ends of the air gaps 108.

As is apparent from the above descriptions, since the spacers 106 interposed between the first conductive patterns 102 and the second conductive patterns 103 do not include a nitride with a high dielectric constant, the parasitic capacitance may be reduced. Furthermore, the parasitic capacitance between the first conductive patterns 102 and the second conductive patterns 103 may be further reduced due to the presence of the air gaps 108.

FIGS. 2A to 2J are cross-sectional views showing a method for fabricating the semiconductor device in accordance with the first embodiment of the present invention.

Figure 2A:
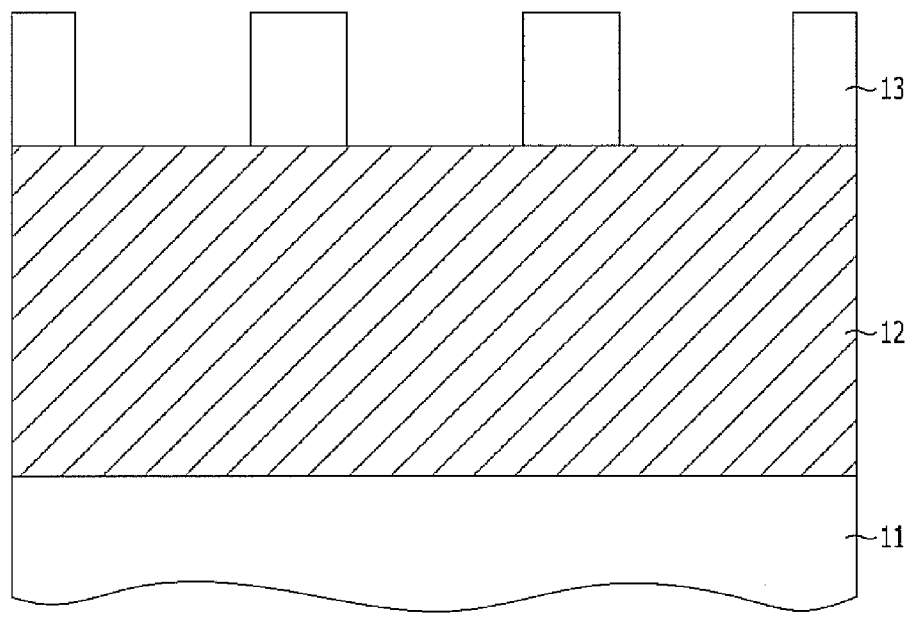
FIGS. 2A to 2J are cross-sectional views showing a method for fabricating the semiconductor device in accordance with the first embodiment of the present invention.

Referring to FIG. 2A, a first conductive layer 12 is formed on a semiconductor substrate 11. A first hard mask layer 13 which is patterned is formed on the first conductive layer 12. The first conductive layer 12 may include a conductive substance such as a polysilicon, a metal, a metal nitride, and a metal silicide. The first conductive layer 12 may be formed of any one of such conductive substances or formed as a stack structure of at least two of such conductive substances. The first hard mask layer 13 may include a silicon nitride.

Figure 2B:
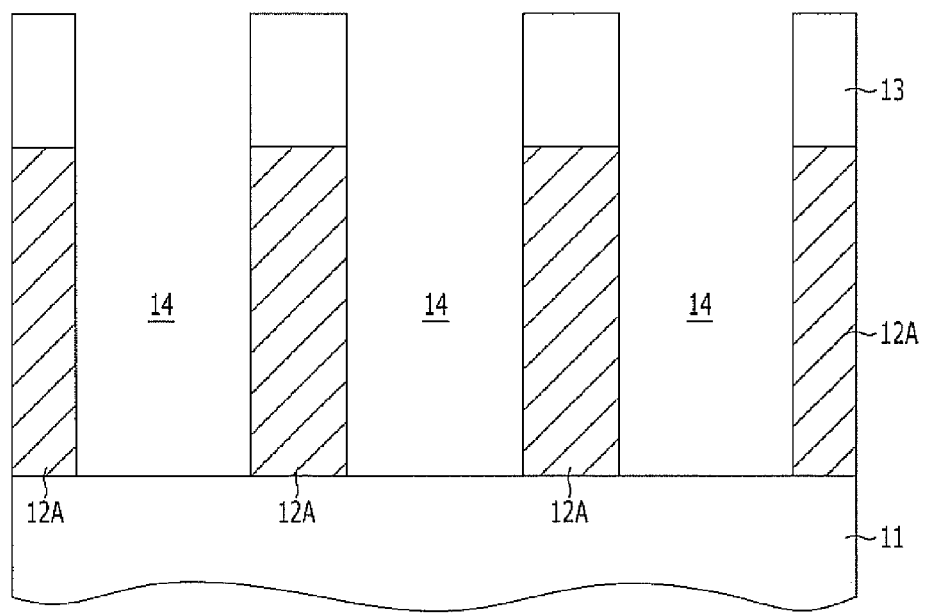

Referring to FIG. 2B, the first conductive layer 12 is etched using the first hard mask layer 13 as an etch barrier. By this fact, a plurality of damascene patterns 14 are formed. A plurality of first conductive patterns 12A are formed to be separated from one another due to the presence of the plurality of damascene patterns 14.

The first conductive patterns 12A may be a line type which extends in any one direction. Also, the first conductive patterns 12A may have plug-like shapes. While not shown, an underlying structure and an interlayer dielectric layer may be additionally formed on the semiconductor substrate 11. The underlying structure may include a conductive substance such as a polysilicon, a metal, a metal nitride, and a metal silicide. The interlayer dielectric layer may include a silicon oxide, a silicon nitride, or the like. The interlayer dielectric layer may cover the underlying structure. The underlying structure may have plug-like shapes which pass through the interlayer dielectric layer. The underlying structure may be formed under the first conductive patterns 12A, or may be exposed between the first conductive patterns 12A. The first conductive patterns 12A may include gate electrodes, bit lines, metal lines, contact plugs, and so on. The first conductive patterns 12A may be regularly disposed with a predetermined gap on the semiconductor substrate 11.

By forming the first conductive patterns 12A as described above, first conductive structures including the first conductive patterns 12A and the hard mask layer 13 are formed on the semiconductor substrate 11. Adjoining first conductive structures are separated from one another by the damascene patterns 14.

Figure 2C:
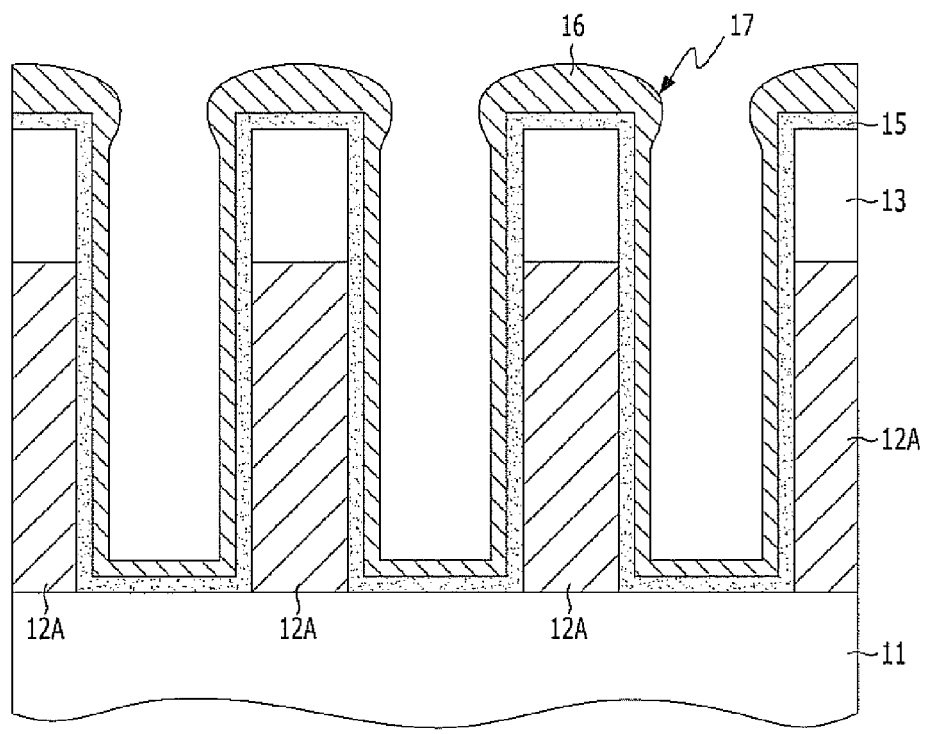

Referring to FIG. 2C, a dielectric layer is formed on the entire surface including the first conductive structures. The dielectric layer is a substance which is used as spacers. The dielectric layer may be formed by stacking a first dielectric layer 15 and a second dielectric layer 16. The first dielectric layer 15 may be formed of a substance which has an etch selectivity with respect to the second dielectric layer 16. For example, the first dielectric layer 15 may include a nitride, and the second dielectric layer 16 may include an oxide. The first dielectric layer 15 may include a silicon nitride or a boron-containing nitride. The boron-containing nitride may include a boron nitride (BN). The silicon nitride has the dielectric constant of about 7, whereas the born nitride has the low dielectric constant of about 2.2 to 5. Thus, when viewed in terms of parasitic capacitance, the boron nitride is more advantageous than the silicon nitride. The second dielectric layer 16 may include a silicon oxide such as $SiO_2$. The second dielectric layer 16 may be formed through PECVD (plasma enhanced chemical vapor deposition) known as having substantially poor step coverage. By forming the second dielectric layer 16 in this way, the second dielectric layer 16 is deposited thickly on the upper ends and the upper corners of the first conductive structures (see the reference numeral '17'). Through this, profiles which are known as overhangs may be formed. The first dielectric layer 15 may be formed through LPCVD (low pressure chemical vapor deposition) or PECVD. In the case where the first dielectric layer 15 includes a boron nitride, a boron-containing gas and a nitrogen-containing gas are reacted to form the boron nitride. The boron-containing gas may include $BCl_3$, $B_2H_6$, $BF_3$, and the like. The nitrogen-containing gas may include $NH_3$, $N_2H_2$, $N_2$, and etc.

Figure 2D:
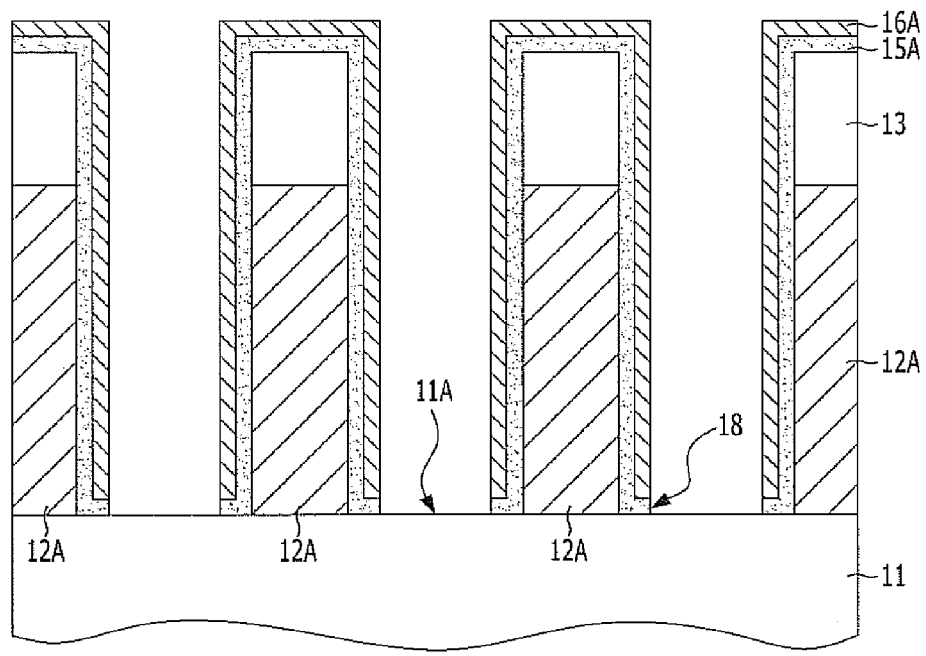

Referring to FIG. 2D, by selectively removing the first dielectric layer 15 and the second dielectric layer 16, surface portions 11A of the semiconductor substrate 11 between the first conductive patterns 12A are exposed. In order to selectively remove the first and second dielectric layers 15 and 16 on the surface portions 11A of the semiconductor substrate 11, an etch-back process may be adopted. After the etch-back process, dielectric patterns constituted by first dielectric patterns 15A and second dielectric patterns 16A are formed. The first dielectric patterns 15A and the second dielectric patterns 16A remain on the upper ends and the sidewalls of the upper portions of the first conductive structures. During the etch-back process, the first dielectric patterns 15A should not be exposed on the upper ends of the first conductive structures. The first dielectric patterns 15A may be exposed to an outside on the lower end portions of the first conductive structures (see the reference numeral '18').

Figure 2E:
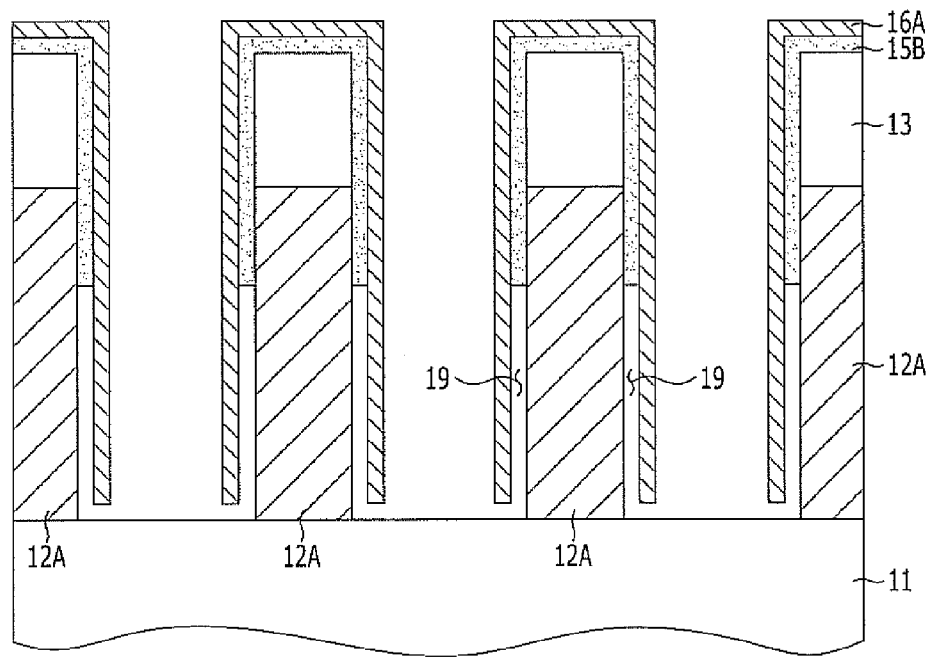

Referring to FIG. 2E, portions of the first dielectric patterns 15A are selectively removed. In the case where the second dielectric patterns 16A include an oxide and the first dielectric patterns 15A include a nitride, the first dielectric patterns 15A are selectively removed by wet cleaning. In the case where the first dielectric patterns 15A include a boron nitride, wet cleaning may be performed with a mixed solution which contains sulfuric acid ($H_2SO_4$) and hydrogen peroxide ($H_2O_2$) as main constituents. In the case where the first dielectric patterns 15A include a silicon nitride, a phosphoric acid ($H_3PO_4$) solution may use in wet cleaning. In this way, by removing the first dielectric patterns 15A through wet cleaning, the first dielectric patterns 15A are removed starting from the lower end portions of the first conductive structures. Because the second dielectric patterns 16A cover the first dielectric patterns 15A on the upper ends and the sidewalls of the first conductive structures, the first dielectric patterns 15A are not etched on the upper ends and the sidewalls of the first conductive structures. By performing wet cleaning in this way, the first dielectric patterns 15A remain as indicated by the reference numeral '15B'.

As described above, by etching the first dielectric patterns 15A from the lower end portions of the first conductive structures, air gaps 19 are defined. The air gaps 19 are empty spaces between the first conductive patterns 12A and the second dielectric patterns 16A. After the air gaps 19 are defined, the first dielectric patterns 15B have isolated shapes which cover the upper ends and the sidewalls of the upper portions of the first conductive structures. The height of the air gaps 19 may be lower than at least the upper surfaces of the first conductive structures. By adjusting the height of the air gaps 19, the first dielectric patterns 15B may remain on the sidewalls of the upper portions of the first conductive structures, by which it is possible to prevent the upper ends of the air gaps 19 from being open when subsequently forming second conductive structures. Consequently, the first dielectric patterns 15B will serve as a capping layer which caps the upper ends of the air gaps 19.

The boron nitride is removed within a short time without attack against a peripheral structure by the mixed solution which contains a sulfuric acid ($H_2SO_4$) and a hydrogen peroxide ($H_2O_2$) as main constituents. As a comparative example, in the case where the first dielectric patterns 15A include a silicon nitride, the silicon nitride may be removed using phosphoric acid ($H_3PO_4$). When comparing the etching speeds of the boron nitride and the silicon nitride, the boron nitride is etched more quickly than the silicon nitride. Accordingly, it is advantageous in terms of attack to use the boron nitride as the first dielectric layer 15 for defining the air gaps 19.

According to the above descriptions, as the born nitride is used as a substance which is removed for defining the air gaps 19, the air gaps 19 may be defined within a short time without attack against the peripheral structure. Furthermore, as the first dielectric patterns 15B remain, the upper ends of the air gaps 19 may be capped in a self-aligned manner.

In the case where the first conductive patterns 12A include a metal, by using the mixed solution containing sulfuric acid, the first conductive patterns 12A may be partially damaged. Therefore, in the case of defining the air gaps 19 by removing the first dielectric patterns 15A using the mixed solution containing sulfuric acid, a polysilicon may be used to form the first conductive patterns 12A. In the case where the first conductive patterns 12A include a metal, a passivation layer (not shown) may be formed in advance before forming the first dielectric layer 15. The passivation layer may include a silicon oxide.

Figure 2F:
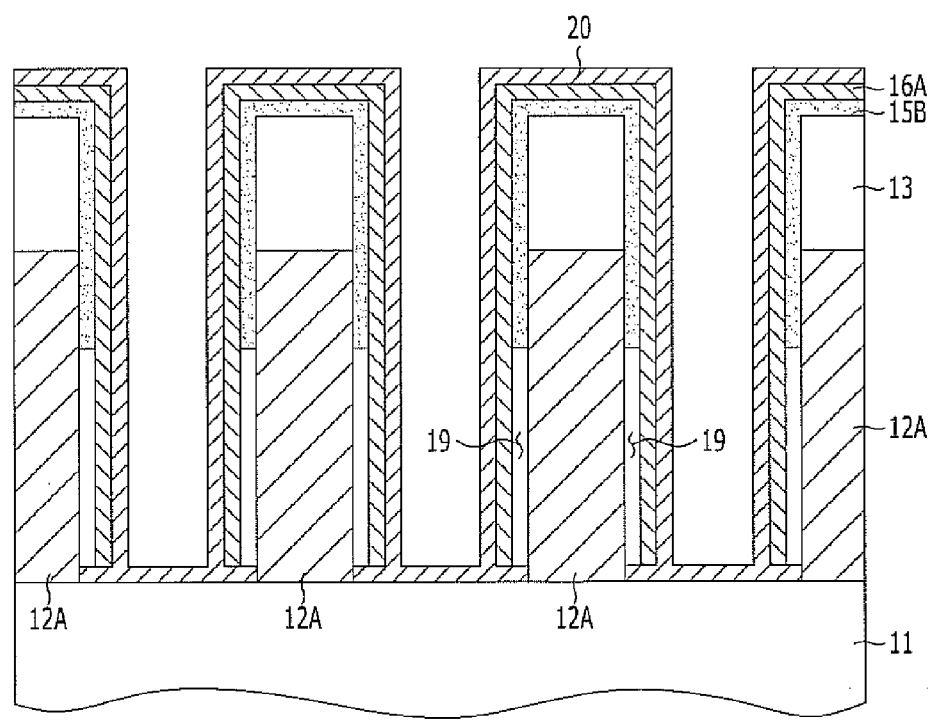

Referring to FIG. 2F, a third dielectric layer 20 is formed. By forming the third dielectric layer 20, the lower ends of the air gaps 19 are closed. The third dielectric layer 20 may be formed of the same substance as the second dielectric patterns 16A. Hence, the third dielectric layer 20 may include an oxide such as a silicon oxide. The third dielectric layer 20 may be formed through LPCVD or PECVD.

Figure 2G:
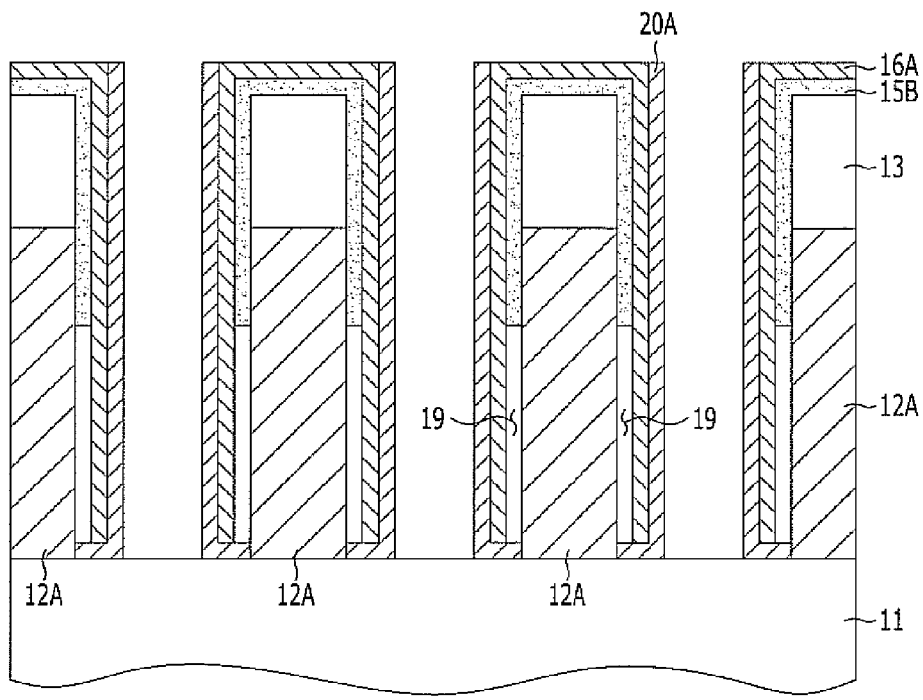

Referring to FIG. 2G, by selectively etching the third dielectric layer 20, surface portions of the semiconductor substrate 11 are exposed. In order to remove the third dielectric layer 20 on the surface portions of the semiconductor substrate 11, an etch-back process may be adopted. Through the etch-back process, third dielectric patterns 20A are formed. The third dielectric patterns 20A remain on the sidewalls of the first conductive structures.

Figure 2H:
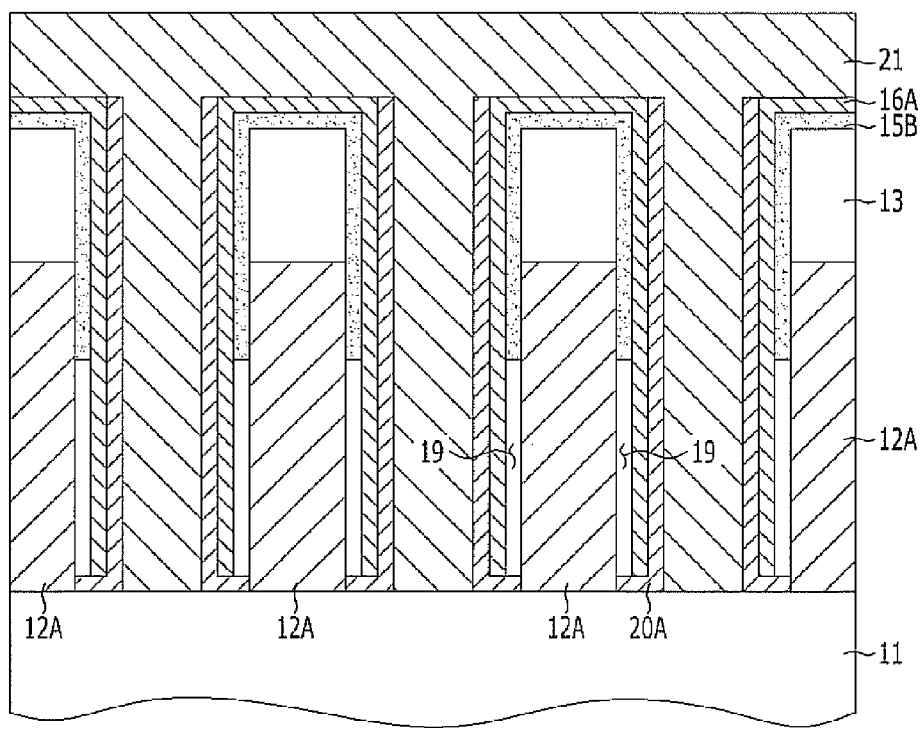

Referring to FIG. 2H, a second conductive layer 21 is formed on the entire surface to gapfill the spaces between the first conductive structures. The second conductive layer 21 may include a conductive substance such as a polysilicon, a metal, a metal nitride, and a metal silicide. The second conductive layer 21 may be formed of any one of such conductive substances or formed as a stack structure of at least two of such conductive substances.

Figure 2I:
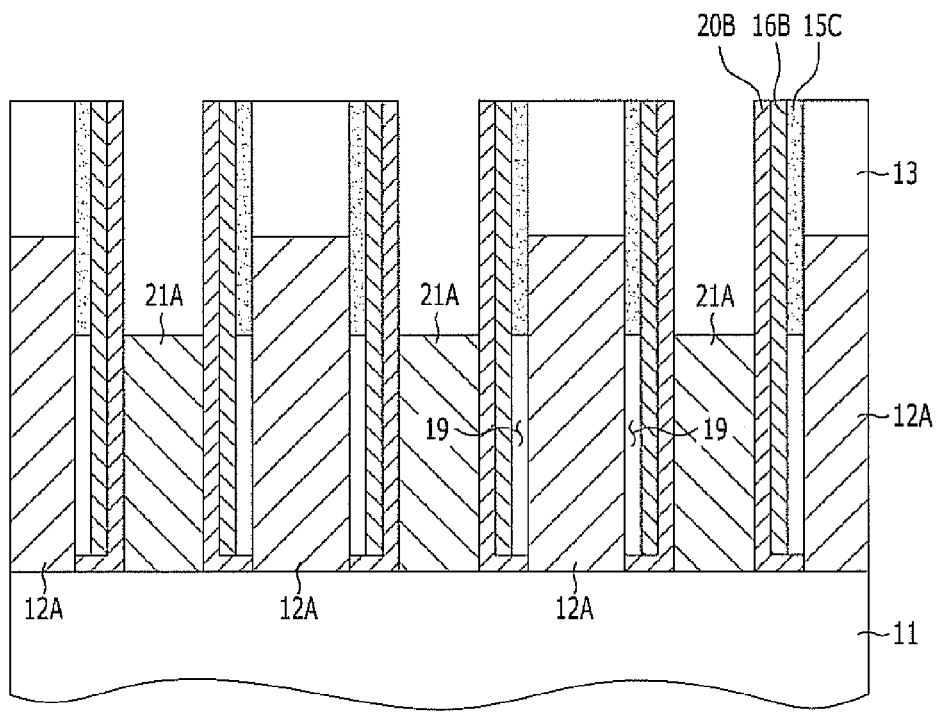

Referring to FIG. 2I, by planarizing and then recessing the second conductive layer 21, second conductive patterns 21A are formed. Planarization may be performed until the upper surfaces of the first conductive structures are exposed. Accordingly, portions of the first dielectric patterns 15B and the second dielectric patterns 16A on the upper ends of the first conductive structures may be removed. After the planarization, the first dielectric patterns and the second dielectric patterns may remain as indicated by the reference numerals '15C' and '16B'. Also, as portions of the third dielectric patterns 20A are removed, the third dielectric patterns may remain as indicated by the reference numeral '20B'. The second conductive patterns 21A may be a line type which extends in any one direction. Further, the second conductive patterns 21A may have shapes like contact plugs. For example, the second conductive patterns 21A may include storage node contact plugs. The first conductive patterns 12A may include bit lines. Moreover, the second conductive patterns 21A may include bit lines. The first conductive patterns 12A may include storage node contact plugs. While not shown, the recessed second conductive patterns 21A may be formed by adding a recessing process after planarizing the second conductive layer 21, and then, a hard mask layer may be additionally formed.

Figure 2J:
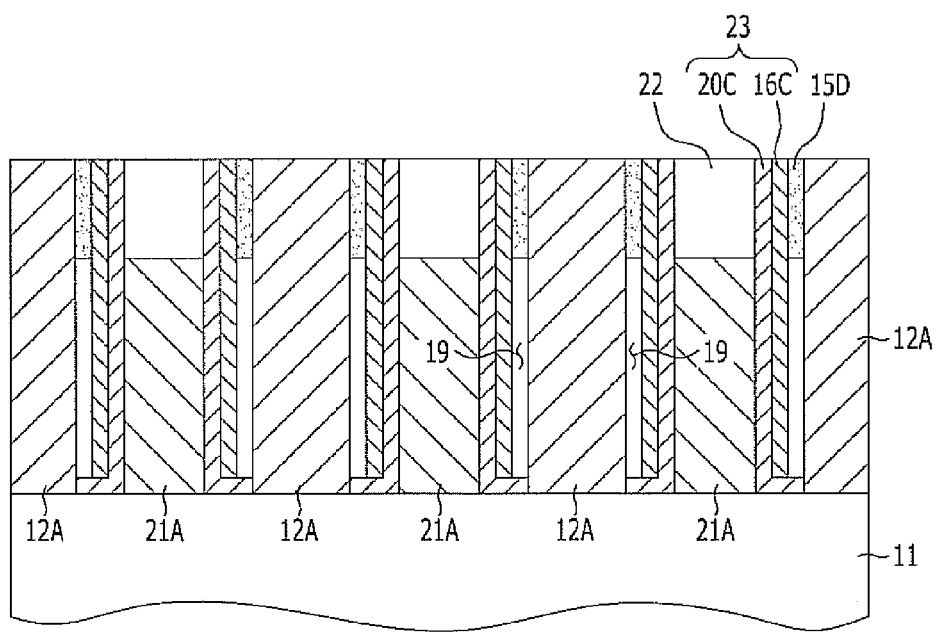

Referring to FIG. 2J, a second hard mask layer 22 may be gapfilled on the second conductive patterns 21A. By this fact, second conductive structures including the second conductive patterns 21A and the second hard mask layer 22 are formed. The second hard mask layer 22 is formed as follows. A dielectric layer is deposited on the entire surface including the second conductive patterns 21A. Thereafter, planarization is performed to expose the upper ends of the first conductive patterns 12A. During the planarization process, the hard mask layer 13 may be removed. Also, during the planarization process, the first dielectric patterns 15C, the second dielectric patterns 16B and the third dielectric patterns 20B may be planarized. As a consequence, the first dielectric patterns, the second dielectric patterns and the third dielectric patterns may remain as indicated by the reference numerals '15D', '16C' and '20C', respectively. The second and third dielectric patterns 16C and 20C will be referred to as spacers 23. The spacers 23 may include first spacers and second spacers. The first spacers are constituted by the second dielectric patterns 16C, and the second spacers are constituted by the third dielectric patterns 20C. The first dielectric patterns 15D serve as a capping layer 15D which caps the upper ends of the air gaps 19.

As the second hard mask layer 22 is formed as described above, the spacers 23 are formed between the first conductive patterns 12A and the second conductive patterns 21A, and the air gaps 19 are defined between the spacers 23 and the first conductive patterns 12A. The capping layer 15D is formed on the upper ends of the air gaps 19.

According to the first embodiment described above, the air gaps 19 are defined between the first conductive patterns 12A and the second conductive patterns 21A. The capping layer 15D for capping the upper ends of the air gaps 19 is formed in a self-aligned manner. Thus, processing may be simplified since an additional process for capping the upper ends of the air gaps 19 is not needed.

Because the spacers 23 between the first conductive patterns 12A and the second conductive patterns 21A do not include a nitride with a high dielectric constant, parasitic capacitance may be reduced. Furthermore, due to the presence of the air gaps 19, the parasitic capacitance between the first conductive patterns 12A and the second conductive patterns 21A may be further reduced. The air gaps 19 with the dielectric constant of 1 significantly reduce the parasitic capacitance between the first conductive patterns 12A and the second conductive patterns 21A. For example, dielectric structures each constituted by the air gap 19, the silicon oxide (of the second dielectric layer pattern 16C) and the silicon oxide (of the third dielectric layer pattern 20C) are formed between the first conductive patterns 12A and the second conductive patterns 21A. The parasitic capacitance may be reduced by the air gaps 19. Because the capping layer 15D does not exist between the first conductive patterns 12A and the second conductive patterns 21A, it does not exert an influence on parasitic capacitance.

Figure 3A:
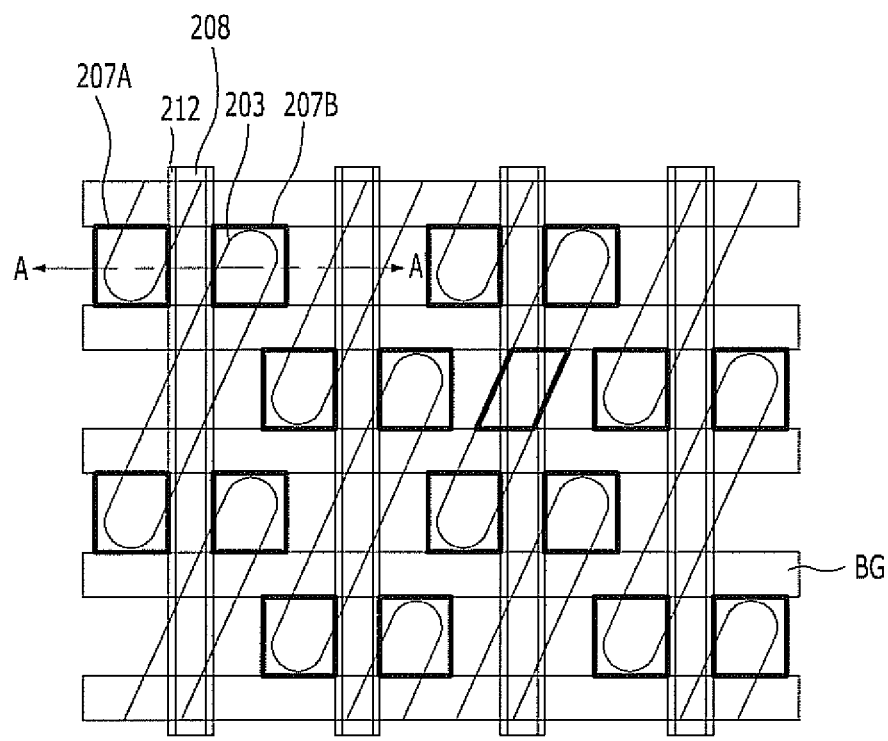
FIG. 3A is a plan view illustrating a semiconductor device in accordance with a second embodiment of the present invention.
Figure 3B:
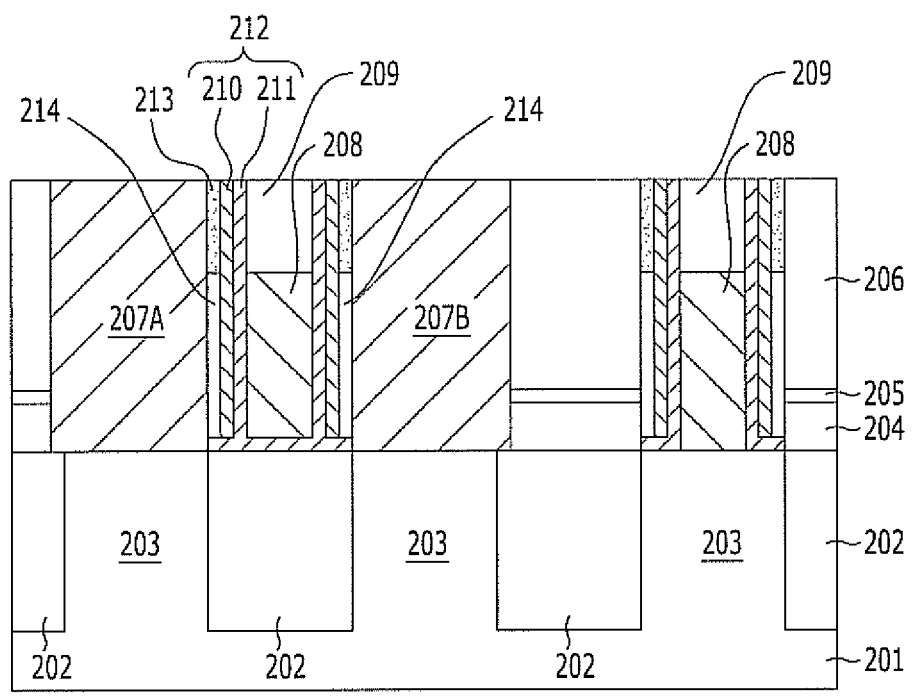
FIG. 3B is a cross-sectional view taken along the line A-A' of FIG. 3A.

FIG. 3A is a plan view illustrating a semiconductor device in accordance with a second embodiment of the present invention, and FIG. 3B is a cross-sectional view taken along the line A-A' of FIG. 3A.

Referring to FIGS. 3A and 3B, isolation regions 202 are defined in a semiconductor substrate 201. Active regions 203 are defined by the isolation regions 202. The active regions 203 are an island type, including storage node contact regions which are contacted with storage node contact plugs 207A and 207B and bit line contact regions which are contacted with bit lines 208. Also, the active region 203 further includes a gate region between the storage node contact region and the bit line contact region where a gate are formed. The gate regions as regions for buried gates (BG) may have trench structures. The gate regions may include recess gates or planar gates.

The storage node contact plugs 207A and 207B are formed on the storage node contact regions of the active regions 203. The bit lines 208 are formed on the bit line contact regions of the active regions 203. The storage node contact plugs 207A and 207B are separated by the bit lines 208. The storage node contact plugs 207A and 207B are formed as the bit lines 208 separate dual storage node contact plugs. The bit lines 208 are formed in such a way as to be filled in damascene patterns which are formed by etching a first interlayer dielectric layer 204, an etch stop layer 205, and a second interlayer dielectric layer 206. Therefore, the bit lines 208 are called damascene bit lines. The dual storage node contact plugs are separated into the individual storage node contact plugs 207A and 207B by the damascene patterns. A bit line hard mask layer 209 is formed on the bit lines 208.

Spacers 212 are formed between the bit lines 208 and the storage node contact plugs 207A and 207B. The spacers 212 may include a plurality of dielectric layers. For example, the spacers 212 may include first spacers 210 and second spacers 211. As the first spacers 210 and the second spacers 211 which constitute the spacers 212, a substance with a low dielectric constant may be selected to reduce parasitic capacitance between the bit lines 208 and the storage node contact plugs 207A and 207б. The first spacers 210 and the second spacers 211 may include substances with the same dielectric constant. The first spacers 210 and the second spacers 211 may be formed of the same substance, for example, an oxide such as $SiO_2$. The first spacers 210 and the second spacers 211 may have spacer shapes which have the same height as the storage node contact plugs 207A and 207B.

The bit lines 208 may include portions which are formed on the active regions 203 and portions which are formed on the isolation regions 202. Accordingly, the spacers 212 are not formed under the portions of the bit lines 208 which are formed on the active regions 203. The spacers 212, in particular, the second spacers 211 are formed under the portions of the bit lines 208 which are formed on the isolation regions 202.

Air gaps 214 are defined between the spacers 212 and the storage node contact plugs 207A and 207B. A capping layer 213 is formed on the air gaps 214. The capping layer 213 may include a nitride. For example, the capping layer 213 may include a silicon nitride or a boron-containing nitride. The boron-containing nitride may include a boron nitride (BN). The capping layer 213 covers the sidewalls of the upper portions of the storage node contact plugs 207A and 207B. The air gaps 214 are defined under the capping layer 213. The air gaps 214 may be defined as portions of the capping layer 213 are removed. Due to the air gaps 214 with the dielectric constant of 1, the parasitic capacitance between the bit lines 208 and the storage node contact plugs 207A and 207B may be significantly reduced. The capping layer 213 caps the upper ends of the air gaps 214. The second spacers 212 serve to cap the lower ends of the air gaps 214.

As is apparent from the above descriptions, since the spacers 212 interposed between the bit lines 208 and the storage node contact plugs 207A and 207B do not include a nitride with a high dielectric constant, the parasitic capacitance may be reduced. Furthermore, the parasitic capacitance between the bit lines 208 and the storage node contact plugs 207A and 207B may be further reduced due to the air gaps 214. The air gaps 214 with the dielectric constant of 1 significantly reduce the parasitic capacitance between the bit lines 208 and the storage node contact plugs 207A and 207B.

FIGS. 4A to 4J are cross-sectional views showing a method for fabricating the semiconductor device in accordance with the second embodiment of the present invention.

Figure 4A:
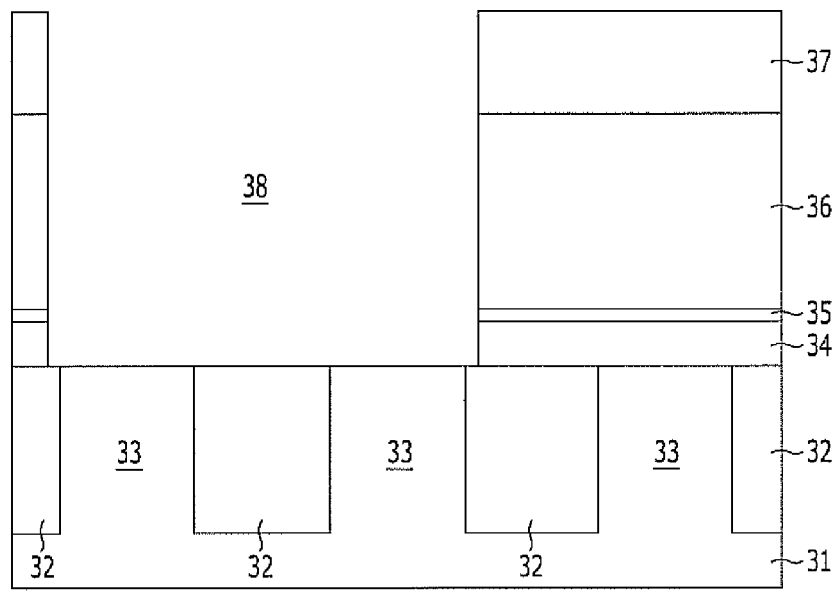
FIGS. 4A to 4J are cross-sectional views showing a method for fabricating the semiconductor device in accordance with the second embodiment of the present invention.

Referring to FIG. 4A, an isolation layer 32 is formed in a semiconductor substrate 31. The isolation layer 32 is formed using an STI (shallow trench isolation) process well known to people skilled in the art. Active regions 33 are defined by the isolation layer 32. While not shown, a buried gate (BG) process may be performed after the step of forming the isolation layer 32. Buried gates BG are not shown on the cross-sectional view taken along the line A-A'. The buried gates BG may be made by processes used in a conventional art.

Then, an interlayer dielectric layer is formed on the surface of the semiconductor substrate 31 including the active regions 33. For example, the interlayer dielectric layer may be formed by stacking a first interlayer dielectric layer, an etch stop layer, and a second interlayer dielectric layer. The first interlayer dielectric layer and the second interlayer dielectric layer include a silicon oxide such as BPSG. The etch stop layer includes a silicon nitride. The etch stop layer serves as an etch stopper in a subsequent damascene process.

While not shown, before forming the interlayer dielectric layer, landing plugs, which are connected with storage node contact plugs and bit lines, may be formed. The landing plugs may be formed in a manner self-aligned with the isolation layer 32. The landing plugs include a polysilicon. In another embodiment, the landing plugs may be formed prior to the isolation layer 32. For example, the landing plugs are formed by forming a conductive layer to be used as the landing plugs and then etching the conductive layer through an STI process. Thereafter, trenches are defined by etching the semiconductor substrate 31 using the landing plugs as an etch barrier. The isolation layer 32 is formed to fill the trenches.

Next, a storage node contact mask 37 is formed on the second interlayer dielectric layer. The storage node contact mask 37 is formed using a photoresist.

In succession, the second interlayer dielectric layer, the etch stop layer, and the first interlayer dielectric layer are etched using the storage node contact mask 37 as an etch barrier. Hereinafter, the etched second interlayer dielectric layer, the etched etch stop layer, and the etched first interlayer dielectric layer are indicated by the reference numerals '36', '35', and '34', respectively. According to this fact, a first open part 38 which simultaneously opens adjoining active regions 33 is defined. Here, the active regions 33 opened by the first open part 38 correspond to storage node contact regions. The active regions 33 are an island type. The active regions 33 include storage node contact regions, which are brought into contact with storage node contact plugs, and bit line contact regions which are brought into contact with bit lines. Also, the active regions 33 further include gate regions between the storage node contact regions and the bit line contact regions where gates are formed. The gate regions as regions for the buried gates BG may have trench structures.

Figure 4B:
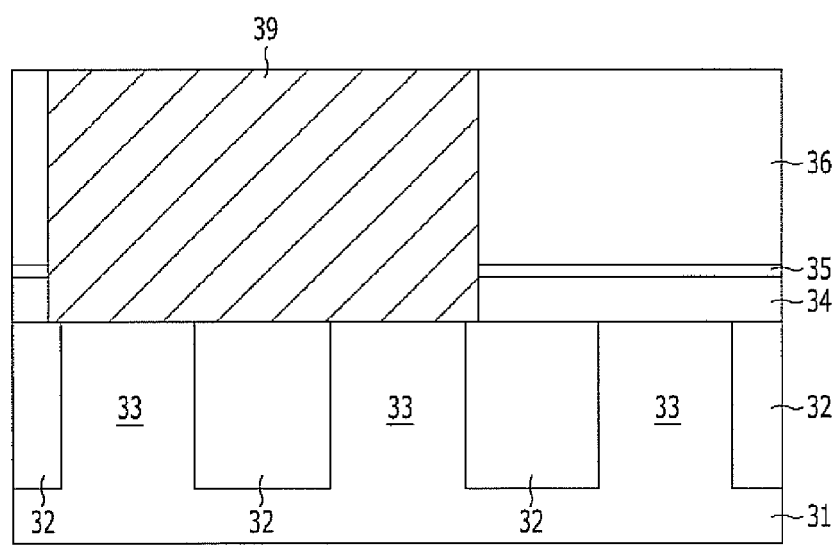

Referring to FIG. 4B, the storage node contact mask 37 is removed. Thereupon, a preliminary storage node contact plug 39 is formed in the first open part 38. In order to form the preliminary storage node contact plug 39, after a polysilicon is deposited, CMP (chemical mechanical polishing) or etch-back is performed. Since the preliminary storage node contact plug 39 is simultaneously connected with the adjoining active regions 33, it is called a merged storage node contact plug.

Figure 4C:
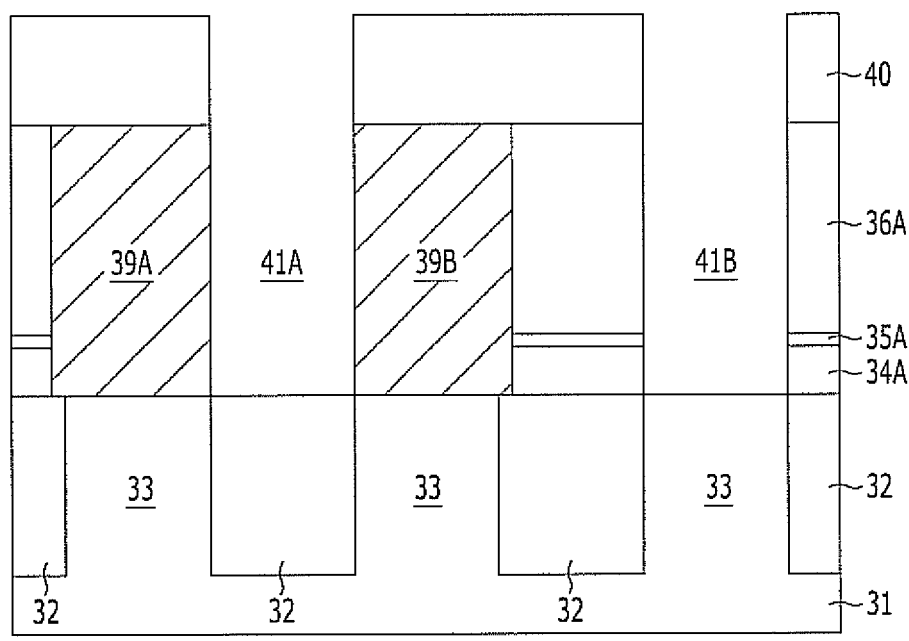

Referring to FIG. 4C, a damascene mask 40 for a damascene process is formed. The damascene mask 40 is a mask which forms damascene patterns for dividing the preliminary storage node contact plug 39 into individual storage node contact plugs and forming bit lines. The damascene mask 40 includes photoresist patterns or hard mask patterns. Hereinafter, the damascene mask 40 will be referred to as 'hard mask patterns 40'. The hard mask patterns 40 include a nitride such as a silicon nitride.

A damascene process is performed using the hard mask patterns 40 as an etch barrier. For example, the preliminary storage node contact plug 39, the second interlayer dielectric layer 36, the etch stop layer 35, and the first interlayer dielectric layer 34 are etched as the hard mask patterns 40 is used as an etch barrier. Accordingly, second open parts are defined. Storage node contact plugs 39A and 39B which are individually separated are formed by the second open parts. In order to define the second open parts, after first etching the preliminary storage node contact plug 39, the second interlayer dielectric layer 36, the etch stop layer 35, and the first interlayer dielectric layer 34 are etched. Also, after the second interlayer dielectric layer 36, the etch stop layer 35, and the first interlayer dielectric layer 34 are etched, the preliminary storage node contact plug 39 may be etched. Furthermore, the second interlayer dielectric layer 36, the etch stop layer 35, the first interlayer dielectric layer 34, and the preliminary storage node contact plug 39 may be simultaneously etched.

Hereinbelow, the second open parts include a first open region 41A, which separates the storage node contact plugs 39A and 39B from each other, and a second open region 41B which exposes the bit line contact region. Damascene patterns become line type trenches which include the first open region 41A and the second open region 41B. The first open region 41A and the second open ration 41B are connected with each other and define one trench.

Figure 4D:
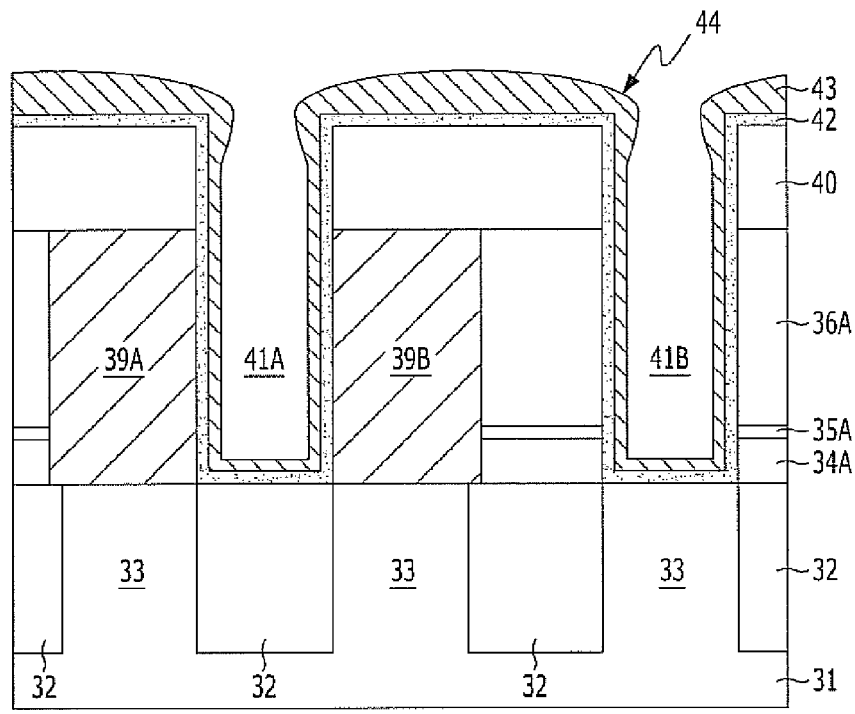

Referring to FIG. 4D, a dielectric layer is formed on the entire surface including the first and second open regions 41A and 41B. The dielectric layer is a substance which is used as spacers. The dielectric layer may be formed by stacking a first dielectric layer 42 and a second dielectric layer 43. The first dielectric layer 42 may be formed of a substance which has an etch selectivity with respect to the second dielectric layer 43. For example, the first dielectric layer 42 may include a nitride. The second dielectric layer 43 may include an oxide. The first dielectric layer 42 may include a silicon nitride or a boron-containing nitride. The boron-containing nitride may include a boron nitride (BN). The silicon nitride has the dielectric constant of about 7, whereas the born nitride has the low dielectric constant of about 2.2 to 5. Thus, in a view of parasitic capacitance, the boron nitride is more advantageous than the silicon nitride. The second dielectric layer 43 may include a silicon oxide such as $SiO_2$. The second dielectric layer 43 may be formed through PECVD known as having substantially poor step coverage. By forming the second dielectric layer 43 in this way, the second dielectric layer 43 is deposited thickly on the upper ends and the upper corners of first conductive structures (see the reference numeral '44'). Through this, profiles which are known as overhangs may be formed. The first dielectric layer 42 may be formed through LPCVD or PECVD. In the case where the first dielectric layer 42 includes a boron nitride, a boron-containing gas and a nitrogen-containing gas are reacted to form the boron nitride. The boron-containing gas may include $BCl_3$, $B_2H_6$, $BF_3$, and etc. The nitrogen-containing gas may include $NH_3$, $N_2H_2$, $N_2$, and etc.

Figure 4E:
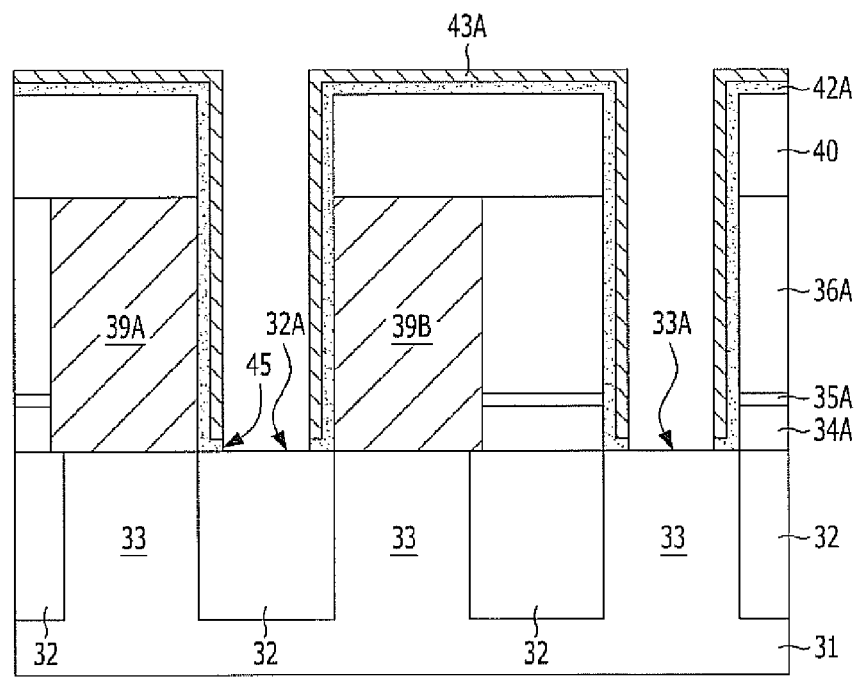

Referring to FIG. 4E, by selectively removing the first dielectric layer 42 and the second dielectric layer 43, surface portions of the semiconductor substrate 31 between the storage node contact plugs 39A and 39B are exposed. The exposed surface portions of the semiconductor substrate 31 are a surface portion 33A of the active region 33 and a surface portion 32A of the isolation region 32. In order to selectively remove the first and second dielectric layers 42 and 43 on the surface portions 32A and 33A of the semiconductor substrate 31, an etch-back process may be adopted. After the etch-back process, dielectric patterns constituted by first dielectric patterns 42A and second dielectric patterns 43A are formed. The first dielectric patterns 42A and the second dielectric patterns 43A remain on the sidewalls of the storage node contact plugs 39A and 39B and on the sidewalls and the upper ends of the hard mask patterns 40. During the etch-back process, the first dielectric patterns 42A should not be exposed on the upper ends of the hard mask patterns 40. The first dielectric patterns 42A may be exposed to an outside on the lower end portions of the storage node contact plugs 39A and 39B (see the reference numeral '45').

Figure 4F:
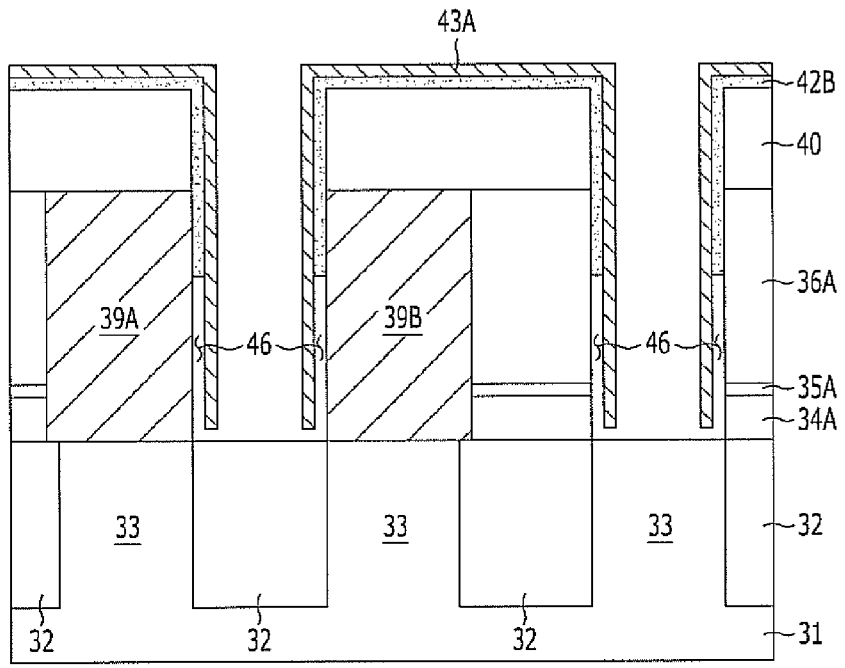

Referring to FIG. 4F, portions of the first dielectric patterns 42A are selectively removed. In the case where the second dielectric patterns 43A include an oxide and the first dielectric patterns 42A include a nitride, the first dielectric patterns 42A are selectively removed using wet cleaning. In the case where the first dielectric patterns 42A include a boron nitride, wet cleaning may use a mixed solution which contains sulfuric acid ($H_2SO_4$) and hydrogen peroxide ($H_2O_2$) as main constituents. In the case where the first dielectric patterns 42A include a silicon nitride, wet cleaning may use a phosphoric acid ($H_3PO_4$) solution. In this way, by removing the first dielectric patterns 42A through wet cleaning, the first dielectric patterns 42A are removed starting from the lower end portions of the storage node contact plugs 39A and 39B. Because the second dielectric patterns 43A cover the sidewalls of the storage node contact plugs 39A and 39B and the sidewalls and the upper ends of the hard mask patterns 40, the storage node contact plugs 39A and 39B and the hard mask patterns 40 are not etched. By performing wet cleaning, the first dielectric patterns 42A remain as indicated by the reference numeral '42B'.

As described above, by etching the first dielectric patterns 42A from the lower end portions of the storage node contact plugs 39A and 39B, air gaps 46 are defined. Empty spaces, that is, the air gaps, 46 are defined between the first dielectric patterns 42B and the second dielectric patterns 43A. After the air gaps 46 are defined, the first dielectric patterns 42B have isolated shapes which may cover the upper ends and the sidewalls of the hard mask patterns 40 and surround the sidewalls of the upper portions of the storage node contact plugs 39A and 39B. The height of the air gaps 46 may be lower than at least the upper surfaces of the storage node contact plugs 39A and 39B. By adjusting the height of the air gaps 46, the first dielectric patterns 42B may remain lower than the upper surfaces of the storage node contact plugs 39A and 39B. It is possible to prevent the upper ends of the air gaps 46 from being open when bit lines are subsequently formed. Consequently, the first dielectric patterns 42B will serve as a capping layer which caps the upper ends of the air gaps 46.

The boron nitride is removed within a short time by the mixed solution which contains sulfuric acid ($H_2SO_4$) and hydrogen peroxide ($H_2O_2$) as main constituents, without attack to a peripheral structure. As a comparative example, in the case where the first dielectric patterns 42A include a silicon nitride, the silicon nitride may be removed using phosphoric acid ($H_3PO_4$). When the etching speeds of the boron nitride and the silicon nitride is compared, the boron nitride is etched more quickly than the silicon nitride. Accordingly, it is advantageous to use the boron nitride as the first dielectric layer 42 for defining the air gaps 46.

According to the above descriptions, as the born nitride is used as a substance which is removed for defining the air gaps 46, the air gaps 46 may be defined within a short time without damage to the peripheral structure. Furthermore, as the first dielectric patterns 42B remain, the upper ends of the air gaps 46 may be capped in a self-aligned manner.

In the case where the storage node contact plugs 39A and 39B include a metal, by using the mixed solution containing sulfuric acid, the storage node contact plugs 39A and 39B may be partially damaged. Therefore, in the case of defining the air gaps 46 by removing the first dielectric patterns 42A using the mixed solution containing sulfuric acid, a polysilicon may be used to form the storage node contact plugs 39A and 39B. In the case where the storage node contact plugs 39A and 39B include a metal, a passivation layer (not shown) may be formed in advance before the first dielectric layer 42 is formed. The passivation layer may include a silicon oxide.

Figure 4G:
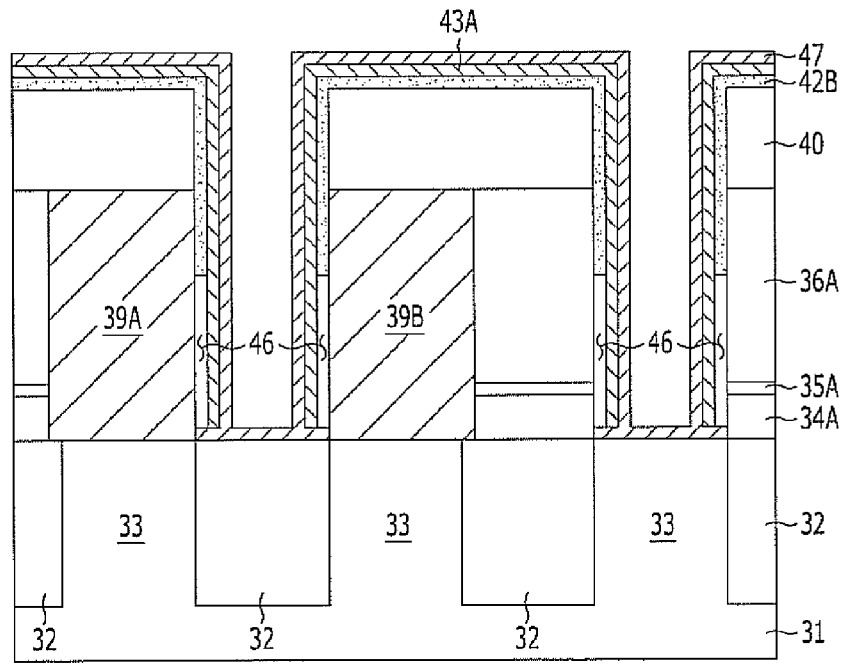

Referring to FIG. 4G, a third dielectric layer 47 is formed. By forming the third dielectric layer 47, the lower ends of the air gaps 46 are closed. The third dielectric layer 47 may be formed of the same substance as the second dielectric patterns 43A. Hence, the third dielectric layer 47 may include an oxide such as a silicon oxide. The third dielectric layer 47 may be formed through LPCVD or PECVD.

Figure 4H:
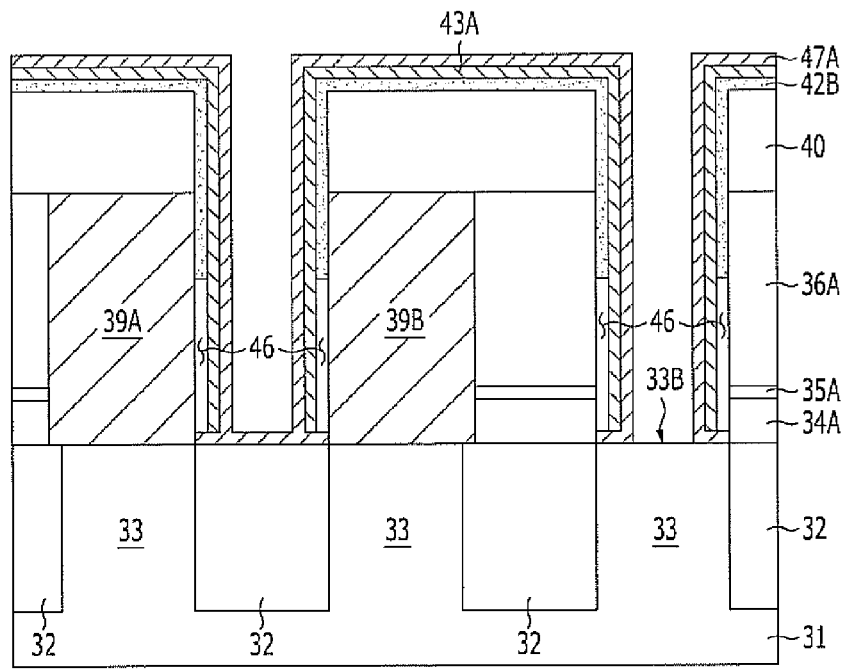

Referring to FIG. 4H, by selectively etching the third dielectric layer 47, the surface of the active region 33 is exposed. The surface of the active region 33 which is exposed may include a bit line contact region. In order to define the bit line contact region, the third dielectric layer 47 may be etched using a separate mask pattern (not shown). Accordingly, the third dielectric layer 47 is selectively removed on a surface 33B of the active region 33 where a bit line is to be formed. The mask pattern may be referred to as a 'bit line contact mask'.

As the third dielectric layer 47 is selectively removed in this way, third dielectric patterns 47A are formed on the sidewalls of the storage node contact plugs 39A and 39B. The third dielectric patterns 47A remain on the isolation regions 32 between the storage node contact plugs 39A and 39B. By leaving the third dielectric patterns 47A on the isolation regions 32 in this way, it is possible to prevent bit lines and the storage node contact plugs 39A and 39B from being short-circuited.

Figure 4I:
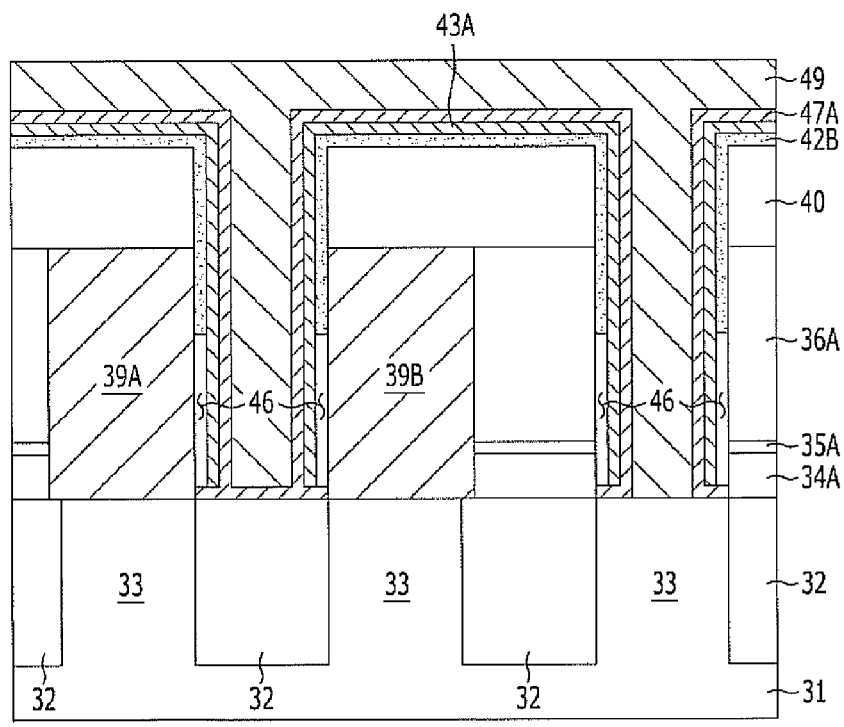

Referring to FIG. 4I, a conductive layer 49 is formed on the third dielectric patterns 47A to gapfill the spaces between the storage node contact plugs 39A and 39B. The conductive layer 49 may include a conductive substance such as a polysilicon, a metal, a metal nitride, and a metal silicide. The conductive layer 49 may be formed of any one of such conductive substances or formed as a stack structure of at least two of such conductive substances.

Figure 4J:
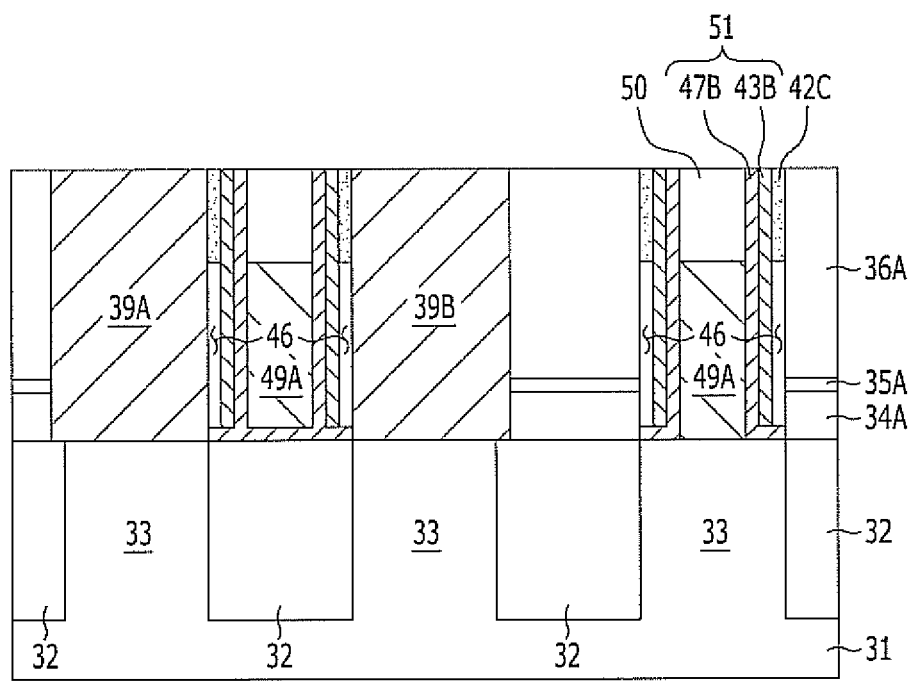

Referring to FIG. 4J, by planarizing and then recessing the dielectric layer 49, bit lines 49A are formed. Planarization may be performed until the upper surfaces of the hard mask patterns 40 are exposed. Accordingly, portions of the first dielectric patterns 42B and the second dielectric patterns 43A formed on the upper surfaces of the hard mask patterns 40 may be removed. After the planarization, the first dielectric patterns and the second dielectric patterns may remain as indicated by the reference numerals '42C' and '43B'. Also, as portions of the third dielectric patterns 47A are removed, the third dielectric patterns may remain as indicated by the reference numeral '47B'. The bit lines 49A may be a line type which extends in any one direction.

Next, a bit line hard mask layer 50 is gapfilled on the bit lines 49A. The bit line hard mask layer 50 is formed as follows. A dielectric layer is deposited on the entire surface including the bit lines 49A. Thereafter, planarization is performed to expose the upper ends of the storage node contact plugs 39A and 39B. During the planarization process, the hard mask patterns 40 may be removed. Also, during the planarization process, the first dielectric patterns 42C, the second dielectric patterns 43B, and the third dielectric patterns 47B may be planarized. As a consequence, the first dielectric patterns, the second dielectric patterns, and the third dielectric patterns may remain as indicated by the reference numerals '42C', '43B', and '47B', respectively. Hereinbelow, the second and third dielectric patterns 43B and 47B will be referred to as spacers 51. The spacers 51 may include first spacers and second spacers. The first spacers are constituted by the second dielectric patterns 43B. The second spacers are constituted by the third dielectric patterns 47B. The first dielectric patterns 42C serve as a capping layer 42C which caps the upper ends of the air gaps 46.

As the bit line hard mask layer 50 is formed as described above, the spacers 51 are formed between the storage node contact plugs 39A and 39B and the bit lines 49A. The air gaps 46 are defined between the spacers 51 and the storage node contact plugs 39A and 39B. The capping layer 42C is formed on the upper ends of the air gaps 46.

According to the second embodiment described above, the air gaps 46 are defined between the storage node contact plugs 39A and 39B and the bit lines 49A. The capping layer 42C for capping the upper ends of the air gaps 46 is formed in a self-aligned manner. Thus, processing may be simplified since an additional process for capping the upper ends of the air gaps 46 is not needed.

Because the spacers 51 do not include a nitride with a high dielectric constant, parasitic capacitance between the storage node contact plugs 39A and 39B and the bit lines 49A may be reduced. Furthermore, the parasitic capacitance between the storage node contact plugs 39A and 39B and the bit lines 49A may be further reduced, because of the air gaps 46 with the dielectric constant of 1. For example, dielectric structures each constituted by the air gap 46, the silicon oxide (of the second dielectric layer pattern 43B) and the silicon oxide (of the third dielectric layer pattern 47B) are formed between the storage node contact plugs 39A and 39B and the bit lines 49A. The parasitic capacitance is reduced by the air gaps 46. Because the capping layer 42C does not exist between the storage node contact plugs 39A and 39B and the bit lines 49A, it does not exert an influence on parasitic capacitance between them.

According to the embodiments of the present invention, since an air gap with the dielectric constant of 1 is defined between a storage node contact plug and a bit line, parasitic capacitance may be significantly reduced.

Furthermore, since a capping layer for capping the air gap is formed through a simply way, process simplification effect may be improved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming, over a substrate, a plurality of first conductive structures which are separated from one another;
    forming multi-layered dielectric patterns including a first dielectric layer which covers upper ends and both sidewalls of the first conductive structures;
    removing portions of the first dielectric layer starting from lower end portions of the first conductive structures to define air gaps; and
    forming second conductive structures which are filled between the first conductive structures.

2. The method of claim 1, wherein the forming of the dielectric patterns comprises:
    forming the first dielectric layer over an entire surface including the first conductive structures;
    forming a second dielectric layer over the first dielectric layer; and
    etching the second dielectric layer and the first dielectric layer such that the second dielectric layer and the first dielectric layer remain while covering both sidewalls and the upper ends of the first conductive structures.

3. The method of claim 2, wherein the first dielectric layer comprises a boron-containing substance.

4. The method of claim 2, wherein the first dielectric layer comprises a boron nitride, and the second dielectric layer comprises a silicon oxide.

5. The method of claim 1, wherein, in the defining of the air gaps, a height of the air gaps is controlled to be lower than an upper surface of a first conductive layer included in the first conductive structures.

6. The method of claim 1, wherein the defining of the air gaps is performed through wet cleaning.

7. The method of claim 1,
    wherein the first dielectric layer comprises a boron nitride, and wherein the defining of the air gaps is performed using a chemical which has sulfuric acid and hydrogen peroxide as main constituents.

8. The method of claim 1, wherein, before the forming of the second conductive structures, the method further comprises:
   forming a third dielectric layer over an entire surface to close lower ends of the air gaps; and
   selectively removing the third dielectric layer such that a surface of the substrate is exposed.

9. The method of claim 8, wherein the third dielectric layer comprises a silicon oxide.

10. The method of claim 1, wherein the forming of the second conductive structures comprises:
    forming a second conductive layer over an entire surface to be filled between the first conductive structures;
    planarizing and recessing the second conductive layer; and
    forming a hard mask layer over the recessed second conductive layer.

11. The method of claim 10, after the forming of the second conductive structures, the method further comprises:
    performing a planarization process to expose an upper surface of a first conductive layer included in the first conductive structures.

12. A method for fabricating a semiconductor device, comprising:
    forming preliminary storage node contact plugs over a substrate;
    forming hard mask patterns over the preliminary storage node contact plugs;
    etching the preliminary storage node contact plugs using the hard mask patterns as an etch barrier, and forming storage node contact plugs which are separated from one another by a plurality of open parts;
    forming multi-layered dielectric patterns including a first dielectric layer which covers both sidewalls of the storage node contact plugs and upper ends and both sidewalls of the hard mask patterns;
    removing portions of the first dielectric layer starting from lower end portions of the storage node contact plugs to define air gaps; and
    filling bit lines in the open parts between the storage node contact plugs.

13. The method of claim 12, wherein, before the forming of the dielectric patterns, the method further comprises:
    forming a passivation layer on an entire surface including the hard mask patterns.

14. The method of claim 13, wherein the passivation layer comprises a silicon oxide, and the first dielectric layer comprises a boron nitride.

* * * * *